(12) United States Patent
Yamaguchi

(10) Patent No.: US 7,233,466 B2
(45) Date of Patent: Jun. 19, 2007

(54) INPUT PROTECTION CIRCUIT

(75) Inventor: Motoi Yamaguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 692 days.

(21) Appl. No.: 10/631,803

(22) Filed: Aug. 1, 2003

(65) Prior Publication Data
US 2004/0021999 A1   Feb. 5, 2004

(30) Foreign Application Priority Data
Aug. 2, 2002   (JP) .............................. 2002-225848

(51) Int. Cl.
*H02H 3/00* (2006.01)
(52) U.S. Cl. ........................................................ 361/56
(58) Field of Classification Search ................... 361/56
See application file for complete search history.

(56) References Cited

U.S. PATENT DOCUMENTS

| | | | |
|---|---|---|---|
| 5,107,146 | A | 4/1992 | El-Ayat |
| 5,764,464 | A * | 6/1998 | Botker et al. .................. 361/56 |
| 5,973,897 | A * | 10/1999 | Opris et al. .................... 361/56 |
| 6,285,536 | B1 * | 9/2001 | Holberg et al. ................ 361/56 |
| 6,882,224 | B1 * | 4/2005 | Gaboury et al. ............. 330/253 |
| 2002/0056885 | A1 | 5/2002 | Kita et al. |
| 2002/0101273 | A1 | 8/2002 | Morishita |
| 2003/0063503 | A1 | 4/2003 | Kiuchi et al. |
| 2003/0165009 | A1 * | 9/2003 | Olivier .................. 359/341.41 |

FOREIGN PATENT DOCUMENTS

| | | |
|---|---|---|
| DE | 102 41 086 A1 | 3/2003 |
| EP | 0 774 834 A1 | 5/1997 |
| JP | 56-045067 | 4/1981 |
| JP | 59-186411 | 10/1984 |
| JP | 61-019163 | 1/1986 |
| JP | 61-119073 | 6/1986 |
| JP | 63-191653 | 12/1988 |
| JP | 05-267458 | 10/1993 |
| JP | 2757701 | 3/1998 |
| JP | 2000-022077 | 1/2000 |
| JP | 2002-151652 A | 5/2002 |
| JP | 2003-158193 A | 5/2003 |
| KR | 2001-0061079 A | 7/2001 |

* cited by examiner

*Primary Examiner*—Ronald W. Leja
(74) *Attorney, Agent, or Firm*—Foley & Lardner LLP

(57) ABSTRACT

An input protection circuit includes an inverting amplifier circuit which converts the potential of an input signal input in such a way that the potential of the input signal lies in the input range of the potential range of a signal inputtable to an IC internal circuit. One protection diode is connected to a virtual ground node between an input resistor and an operational amplifier and a positive power-supply terminal to allow the input signal which has excessively exceeded the input range on the positive power-supply terminal side to flow toward the positive power-supply terminal, and another protection diode is connected to an arbitrary point between an input terminal and the input resistor and a negative power-supply terminal to allow the input current of the input signal which has excessively exceeded the input range on the negative power-supply terminal side to flow toward the input terminal from the negative power-supply terminal, thereby protecting the IC internal circuit.

15 Claims, 9 Drawing Sheets

INPUT PROTECTION CIRCUIT

BACKGROUND OF THE INVENTION

1. Field of the Invention

The present invention relates to an input protection circuit for a semiconductor integrated circuit, and, more particularly, to an input protection circuit which protects a semiconductor integrated circuit against a static damage.

2. Description of the Related Art

There has been a known problem that when static electricity of a high voltage is applied to a semiconductor integrated circuit (hereinafter referred to as "IC"), the internal circuit of the IC is statically damaged. To prevent such a static damage on an IC, various techniques have been proposed.

As an ordinary technique to prevent a static damage on an IC, to protect the internal circuit of the IC (hereinafter also referred to as "IC internal circuit") against static noise or the like, a plurality of static protection diodes are arranged in series between both power supplies at the peripheral portion of an input terminal to which a signal is input. The static protection diodes are connected between the input terminal and the positive power supply and between the input terminal and the negative power supply. Therefore, it is not possible to input a voltage signal with a voltage (negative power supply voltage–diode's threshold voltage) and a voltage signal with a voltage (positive power supply voltage+diode's threshold voltage) to the input terminal.

Such a conventional input protection circuit will be discussed below referring to FIGS. 1 to 4. FIG. 1 is a block diagram showing one example of the conventional input protection circuit. As shown in FIG. 1, the input protection circuit is constructed by connecting protection diodes D1001 and D1002 between an input terminal T1001 and a positive power-supply terminal T1002 and between the input terminal T1001 and a negative power-supply terminal T1003, respectively. In the conventional input protection circuit shown in FIG. 1, the protection diodes D1001 and D1002 are connected directly to the input terminal T1001. An input protection circuit which is constructed like the circuit in FIG. 1 is disclosed in, for example, Japanese Patent No. 2757701 and Japanese Patent Laid-Open No. 2000-22077.

Given that VDD is a positive power-supply potential level, VSS is a negative power-supply potential level and VF is a threshold voltage of the protection diodes D1001 and D1002 (also called a forward drop voltage which is generally about 0.7 V), when a potential V1 to be applied to the input terminal T1001 becomes greater than VDD+VF, the protection diode D1001 is turned on. When the potential V1 to be applied to the input terminal T1001 becomes smaller than VSS–VF, on the other hand, the protection diode D1002 is turned on. As shown in FIG. 2, therefore, the conventional input protection circuit shown in FIG. 1 cannot transfer the input signal exceeding VDD+VF or the input signal lower than VSS–VF to an internal circuit 1001.

Even if the potential of the input signal to be input to the input terminal T1001 does not become greater than VDD+VF, the forward bias voltage is applied to the protection diode D1001 when the potential of the input signal exceeds VDD. This produces a forward leak current I1002 from the input terminal T1001 toward the positive power-supply terminal T1002.

Further, in case where the input impedance of the internal circuit 1001 is finite, when part of an input signal current I1001 that should inherently flow toward the internal circuit 1001 flows toward the positive power-supply terminal T1002 via the protection diode D1001 when the input signal potential V1 exceeds VDD, as shown in FIG. 3. As a result, the input signal waveform is distorted by the leak current I1002 that flows, separated, toward the positive power-supply terminal T1002 from the protection diode D1001.

The same is true of the protection diode D1002, and a forward leak current I1004 is produced in the protection diode D1002, as shown in FIG. 4, when the input signal potential gets lower than VSS, thus deforming the input signal waveform.

In case of the input protection circuit disclosed in Japanese Patent Laid-Open No. 2000-22077 where elements, such as input resistors, of an inverting amplifier circuit are connected between the input terminal T1001 and the protection diodes D1001 and D1002, when static electricity of a high voltage which statically damages the internal circuit of the IC is applied, the elements to be connected to the input terminal T1001 are statically damaged before the internal circuit of the IC is statically damaged.

As discussed above, the conventional input protection circuits had a problem such that an input signal whose potential would exceed the positive power-supply potential or an input signal whose potential would become lower than the positive power-supply potential would be deformed. Further, in case where an attempt is made to solve the problem by the method disclosed in Japanese Patent Laid-Open No. 2000-22077, the input resistor may be statically damaged.

SUMMARY OF THE INVENTION

Accordingly, it is an object of the invention to provide an input protection circuit which keeps the waveform of an input signal in the proper state while preventing a static damage and further prevents an input resistor from being statically damaged.

To achieve the object, according to the first aspect of the invention, there is provided an input protection circuit for protecting an internal circuit from an excessive signal originated from static electricity or the like, comprising input signal conversion section (e.g., an inverting amplifier circuit 10 in one embodiment of the invention) which has at least an input resistor, a feedback resistor and an operational amplifier and converts a potential of an input signal input from an input terminal in such a way that the potential of the input signal lies in an input range or a range of a signal potential inputtable to the internal circuit; first protection section (e.g., a protection diode D1 in one embodiment of the invention), connected to a virtual ground node between the input resistor and the operational amplifier and a first power-supply potential, for protecting the internal circuit by allowing an input current of the input signal to flow toward the first power-supply potential when the potential of the input signal excessively exceeds the input range on the first power-supply potential side; and second protection section (e.g., a protection diode D2 in one embodiment of the invention), connected to an arbitrary point between the input terminal and the input resistor and a second power-supply potential, for protecting the internal circuit by allowing the input current to flow toward the input terminal from the second power-supply potential when the potential of the input signal excessively exceeds the input range on the second power-supply potential side. This structure can keep the waveform of the input signal in the proper state while preventing the internal circuit from being damaged static electricity and further prevents the input resistor from being statically damaged.

According to the second aspect of the invention, there is provided an input protection circuit for protecting an internal circuit from an excessive signal originated from static electricity or the like, comprising input signal conversion section (e.g., an inverting amplifier circuit 10 in one embodiment of the invention) which has at least an input resistor, a feedback resistor and an operational amplifier and converts a potential of an input signal input from an input terminal in such a way that the potential of the input signal lies in an input range or a range of a signal potential inputtable to the internal circuit; first protection section (e.g., a protection diode D1 in one embodiment of the invention), connected to an arbitrary point between the input terminal and the input resistor and a first power-supply potential, for protecting the internal circuit by allowing an input current of the input signal to flow toward the first power-supply potential when the potential of the input signal excessively exceeds the input range on the first power-supply potential side; and second protection section (e.g., a protection diode D2 in one embodiment of the invention), connected to a virtual ground node between the input resistor and the operational amplifier and a second power-supply potential, for protecting the internal circuit by allowing the input current to flow toward the input terminal from the second power-supply potential when the potential of the input signal excessively exceeds the input range on the second power-supply potential side. This structure can keep the waveform of the input signal in the proper state while preventing the internal circuit from being damaged static electricity and further prevents the input resistor from being statically damaged.

In the input protection circuit of the invention, the input signal conversion section converts the potential of the input signal input from the input terminal in such a way that the potential of the input signal lies in the input range when the potential of the input signal exceeds the first power-supply potential or the second power-supply potential. In case where an input signal whose potential is beyond the input range of the internal circuit, therefore, the waveform of the input signal can reliably be kept in the proper state.

In the input protection circuit of the invention, the operational amplifier changes a potential at the virtual ground node by changing a bias potential so as to convert the potential of the input signal input from the input terminal in such a way that the potential of the input signal having exceeded the input range lies in the input range. This structure can surely convert the input signal in such a way that its potential falls in the input range of the internal circuit.

In the input protection circuit of the invention, the feedback resistor has a plurality of resistors and a switch for switching connection of the plurality of resistors. This structure can cope with a case where the potential of the input signal differs.

In the input protection circuit of the invention, the operational amplifier is a differential operational amplifier to which the input signal is differentially input. In case of amplifying the input signal further, therefore, this structure can keep the waveform of the input signal in the proper state while preventing the internal circuit from being damaged static electricity and further prevents the input resistor from being statically damaged.

DETAILED DESCRIPTION OF THE PREFERRED EMBODIMENTS

Preferred embodiments of the invention will be described below with reference to the accompanying drawings.

(First Embodiment)

In an input protection circuit according to the first embodiment of the invention, two protection diodes are connected between an input terminal and positive and negative power supplies, respectively, and the protection diode located between the input terminal and the negative power supply is connected directly to the input terminal.

Figure 1:
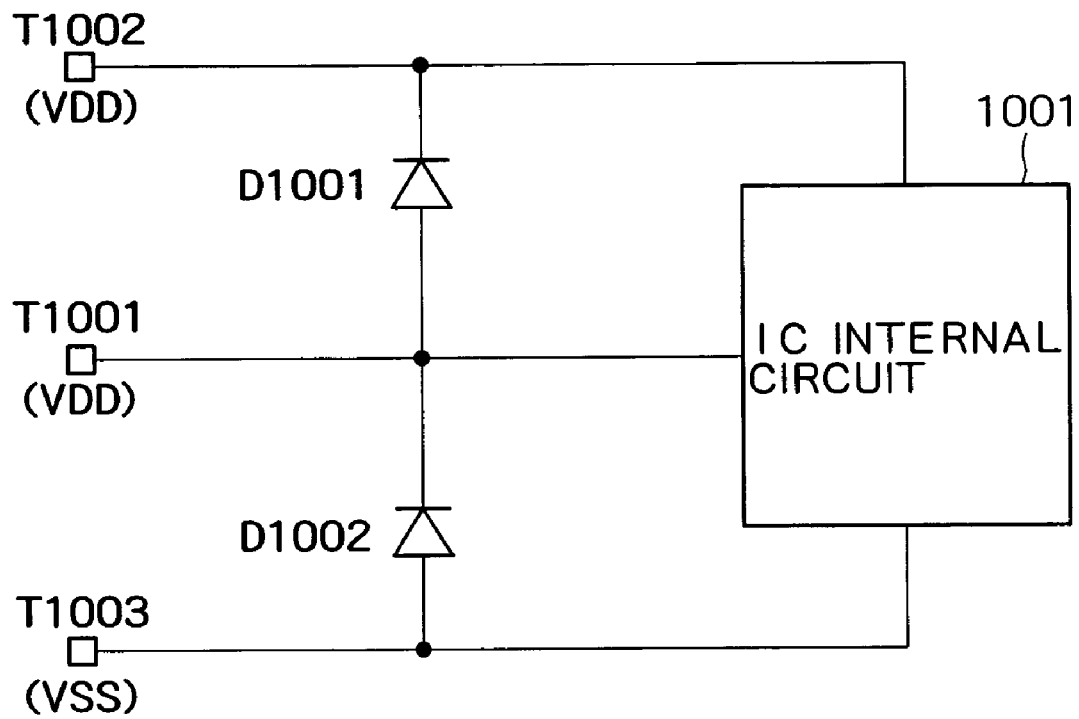
FIG. 1 is a block diagram showing an input protection circuit according to prior art.
Figure 2:
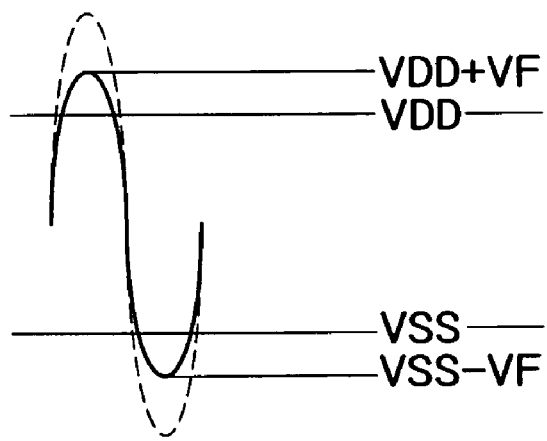
FIG. 2 is a signal level diagram illustrating an input signal to the input protection circuit according to the prior art.
Figure 3:
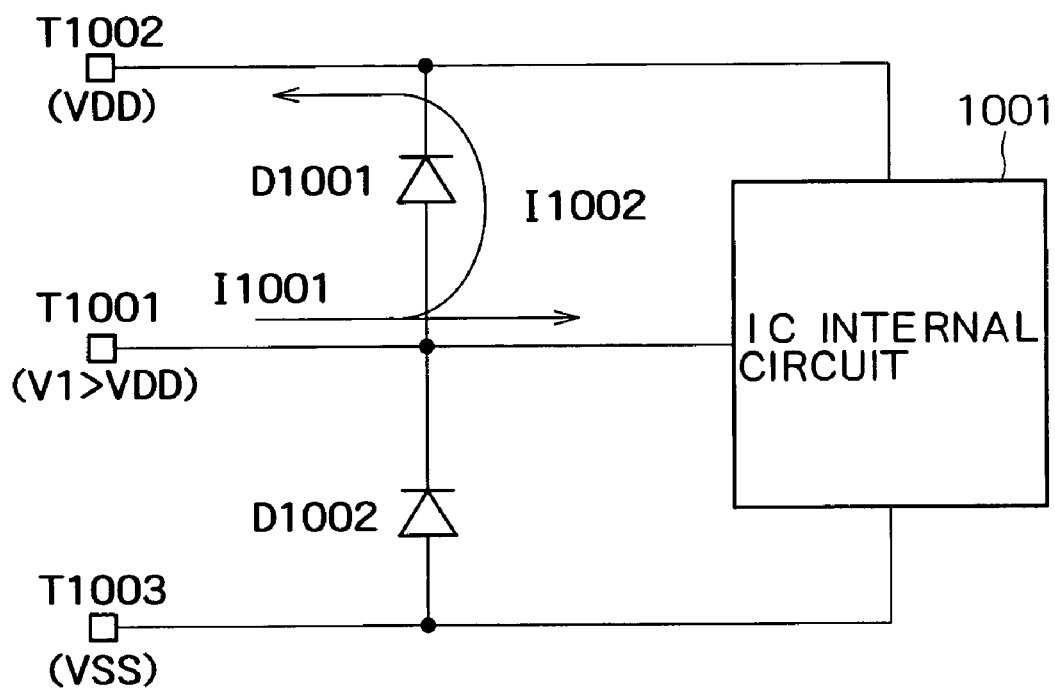
FIG. 3 is a block diagram illustrating the operation of the input protection circuit according to the prior art.
Figure 4:
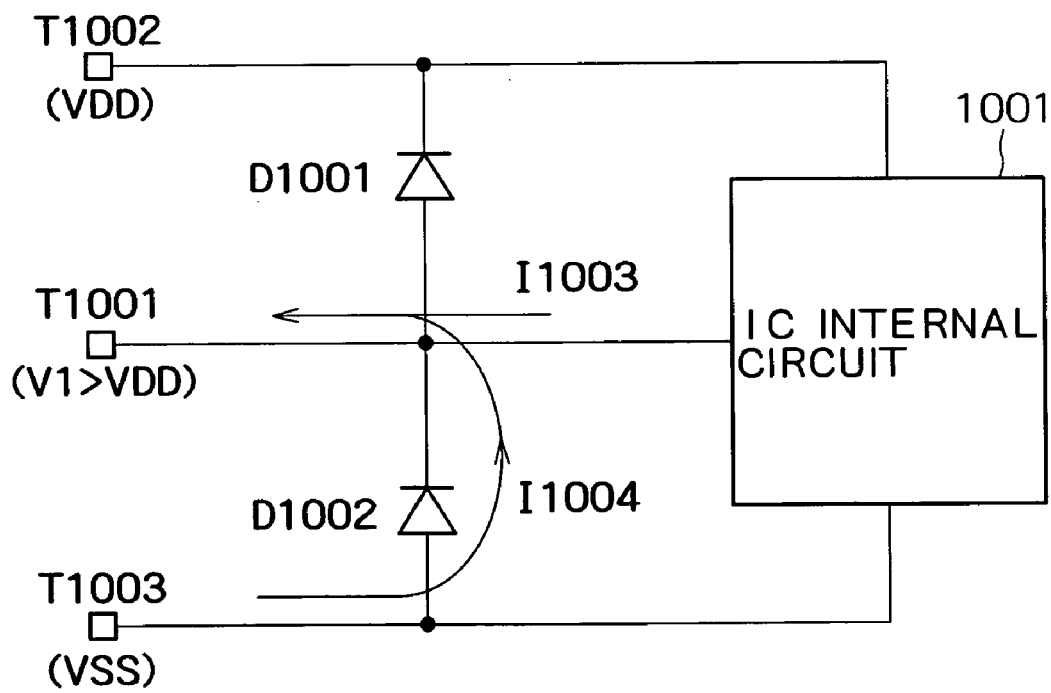
FIG. 4 is a block diagram illustrating the operation of the input protection circuit according to the prior art.
Figure 5:
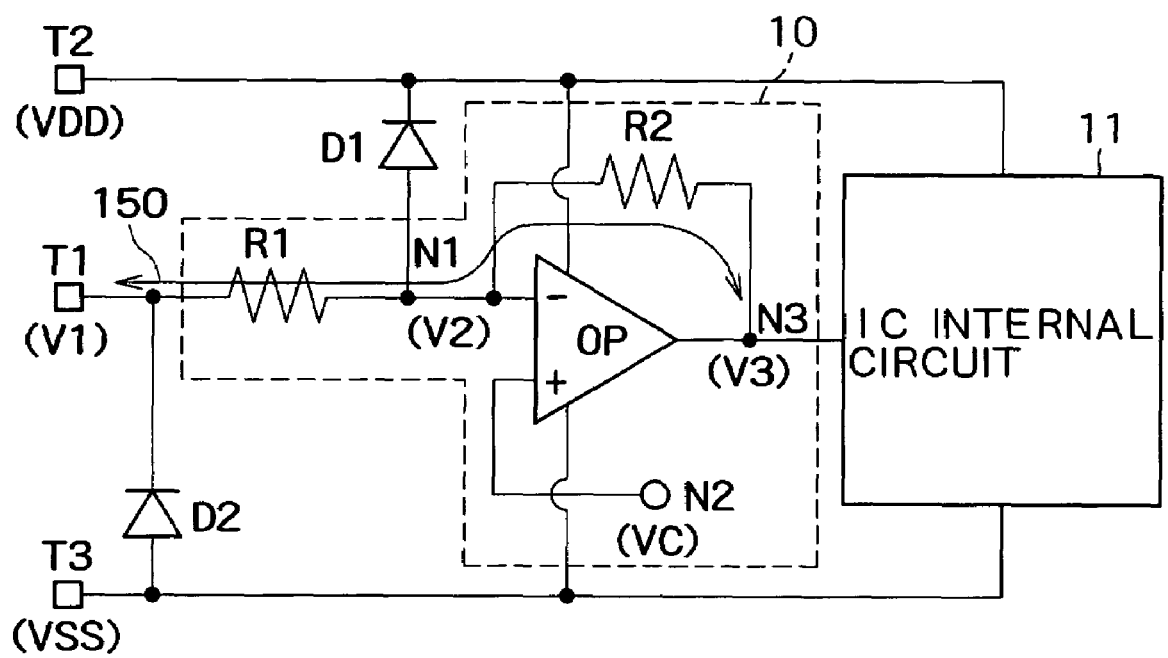
FIG. 5 is a block diagram showing an input protection circuit according to a first embodiment of the invention.

To begin with, the input protection circuit of the first embodiment will be discussed referring to FIG. 5. FIG. 5 is a block diagram showing the input protection circuit according to the first embodiment. As shown in FIG. 5, the input protection circuit comprises an inverting amplifier circuit 10 and protection diodes D1 and D2 as basic components.

The inverting amplifier circuit 10 has an operational amplifier OP and resistors R1 and R2. The operational amplifier OP is a well-known operational amplifier which amplifies a potential difference applied to an inverting input terminal indicated by symbol "−" (minus) and a non-inverting input terminal indicated by symbol "+" (plus) and outputs the amplified potential.

The resistors R1 and R2 are ordinary resistor elements. It is desirable that the resistors R1 and R2 should be made of the same material so as to have the same characteristic. In a semiconductor integrated circuit, particularly, it is desirable to form the resistors R1 and R2 using polycrystalline silicon (polysilicon) whose resistance has a low voltage dependence. The resistors R1 and R2 may be formed by using a semiconductor layer, such as a P-type diffusion layer or an N-type diffusion layer.

The protection diode D1 is connected to a positive power-supply terminal T2 and a virtual ground node N1 of the inverting amplifier circuit 10, as shown in FIG. 5. That is, the protection diode D1 is connected to the inverting input terminal (−) of the operational amplifier OP. As shown in FIG. 5, the protection diode D1 is also connected in such a way as to be forward-biased as viewing the positive power-supply terminal T2 from the virtual ground node N1.

The protection diode D2 is connected to a negative power-supply terminal T3 and a signal input terminal T1. That is, the protection diode D2 is connected to the resistor R1. As shown in FIG. 5, the protection diode D2 is also connected in such a way as to be reverse-biased as viewing the negative power-supply terminal T3 from the signal input terminal T1. The signal input terminal T1 is connected to an IC internal circuit 11 via the input protection circuit which is constituted this way by the inverting amplifier circuit 10 and the protection diodes D1 and D2.

Figure 6:
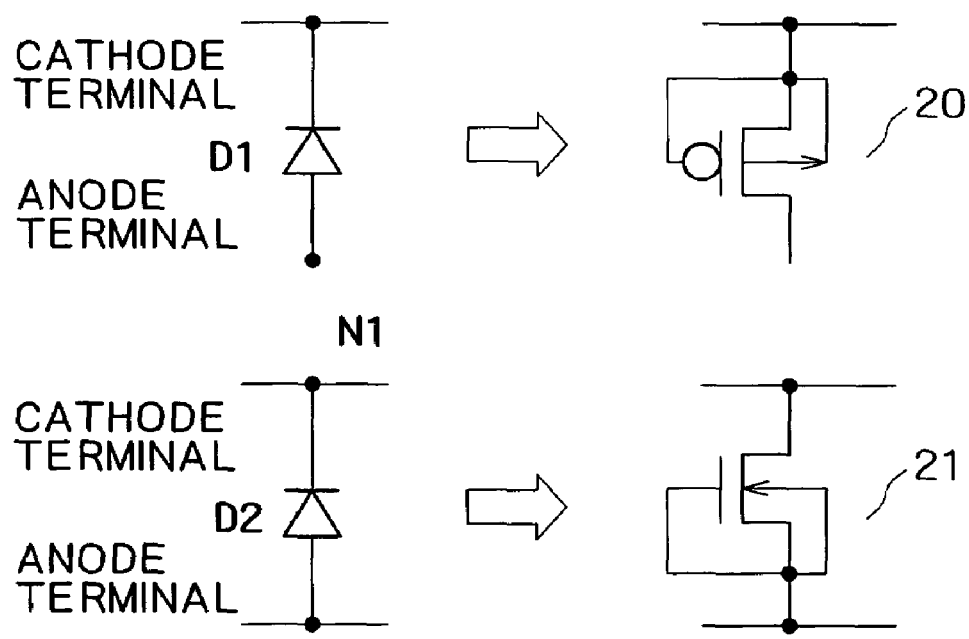
FIG. 6 is a block diagram showing protection diodes in the first embodiment of the invention.

The protection diodes D1 and D2 can be formed by using two semiconductor layers, a P-type diffusion layer and an N-type diffusion layer, in a semiconductor integrated circuit. The protection diodes can also be formed by using MOS transistors. As shown in FIG. 6, for example, the protection diode D1 connected between the positive power-supply terminal T2 and the virtual ground node N1 in FIG. 5 can be constituted by using a P-type MOS transistor 20. In this case, the protection diode D1 can be constructed by connecting the source terminal and gate terminal of the transistor 20 together (source-gate connected) to be the cathode terminal, and letting the drain terminal serve as the anode terminal. Further, as shown in FIG. 6, for example, the protection diode D2 connected between the negative power-supply terminal T3 and the virtual ground node N1 in FIG. 5 can be constituted by using an N-type MOS transistor 21. In this case, the protection diode D2 can be constructed by connecting the source terminal and gate terminal of the transistor 21 together (source-gate connected) to be an anode terminal, and letting the drain terminal serve as the cathode terminal.

Figure 7:
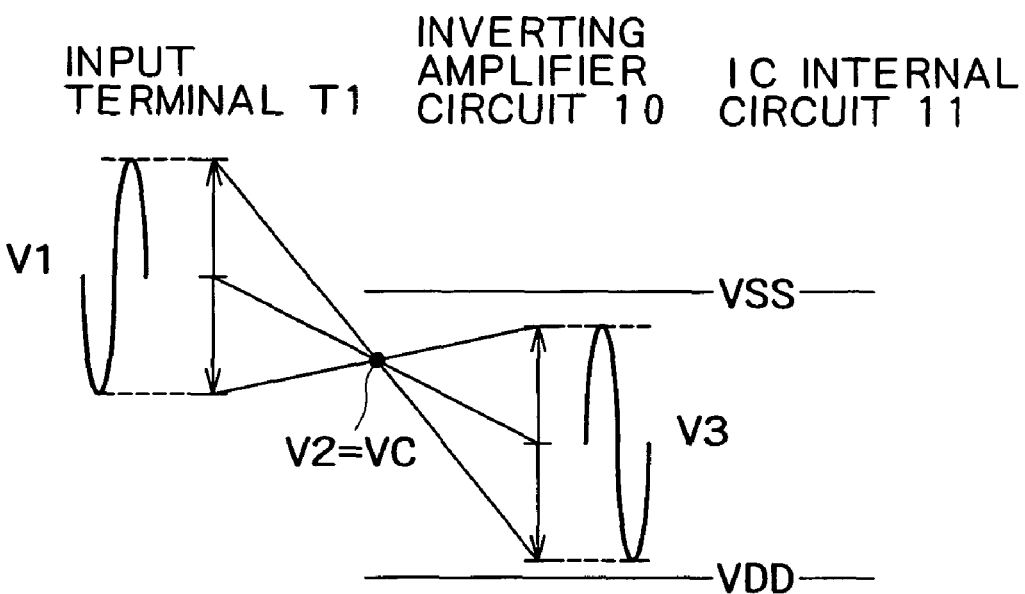
FIG. 7 is a signal level diagram illustrating an input signal to the input protection circuit according to the first embodiment of the invention.
Figure 8:
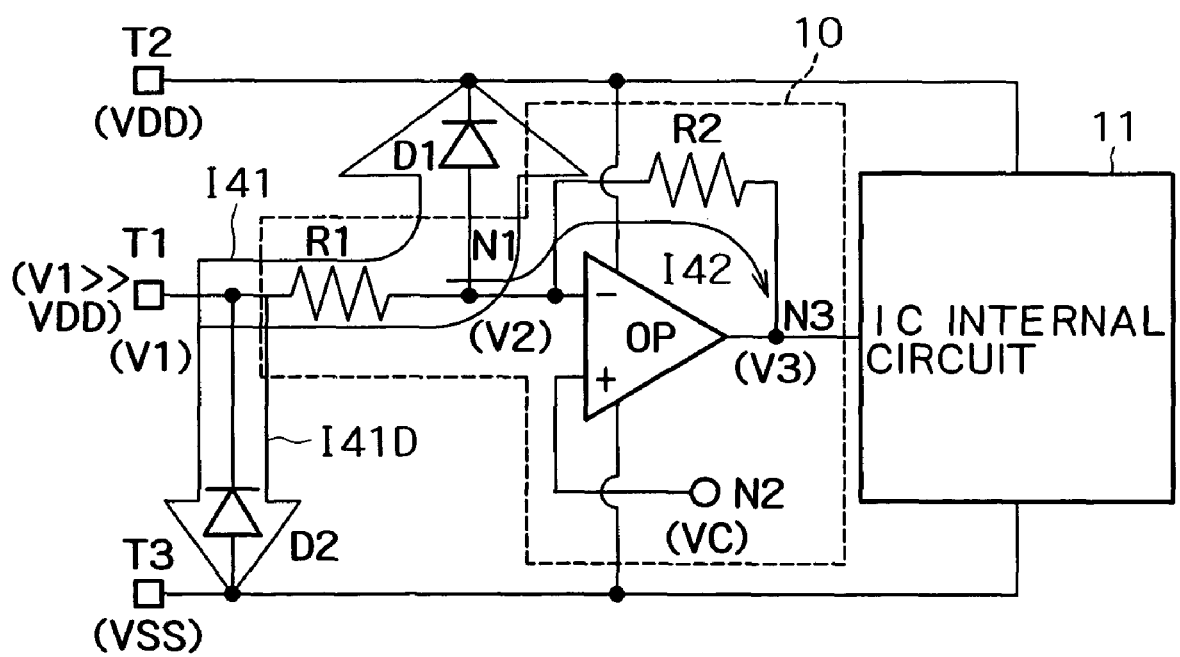
FIG. 8 is a block diagram illustrating the operation of the input protection circuit according to the first embodiment of the invention.
Figure 9:
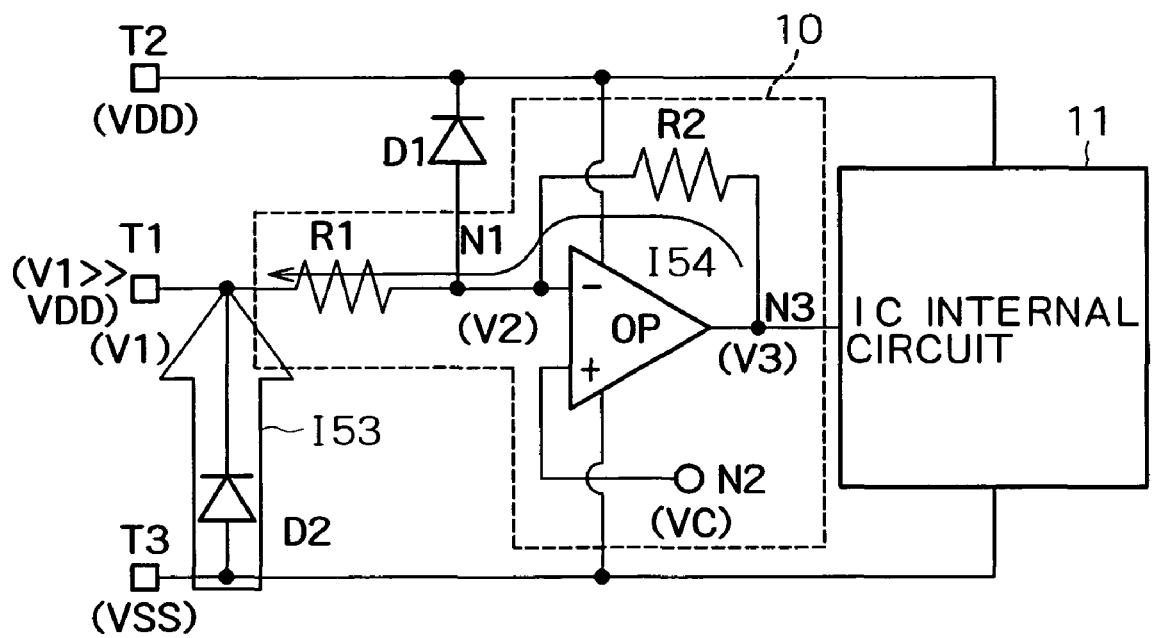
FIG. 9 is a block diagram illustrating the operation of the input protection circuit according to the first embodiment of the invention.

Referring now to FIGS. 7 to 9, the operation of the input protection circuit according to the first embodiment will be discussed. FIG. 7 is a signal level diagram illustrating an input signal to the input protection circuit according to the first embodiment. FIGS. 8 and 9 are block diagrams illustrating the operation of the input protection circuit according to the first embodiment.

FIG. 7 illustrates the relationship among the individual potential levels where VDD is the level of a potential to be applied to the positive power-supply terminal T2, VSS is the level of a potential applied to the negative power-supply terminal T3, V1 is the potential level of the input signal to be applied to the signal input terminal T1, VC is the level of a bias potential to be applied to a bias input terminal N2 and V3 is the potential level of a signal to be input the IC internal circuit 11.

In general, when the operational amplifier circuit has an ideal characteristic, the potential level V2 at the virtual ground node N1 is always kept at the same potential as the potential level VC of the bias input terminal N2. Further, the real operational amplifier circuit can be assumed to be an element whose characteristic is close enough to the ideal characteristic. In the range where the inverting amplifier circuit 10 operates normally, therefore, the potential level V2 at the virtual ground node N1 is always kept at approximately the same potential as the potential level VC of the bias input terminal N2 and it is possible to consider that V2=VC. Provided that the resistance of the resistor R1 is r1 and the resistance of the resistor R2 is r2 in the inverting amplifier circuit 10 in FIG. 5, the input potential V1 and output potential V3 of the inverting amplifier circuit 10 satisfy a relationship given by the following equation 1.

$$V3-VC=-(r2/r1)\times(V1-VC) \quad (1)$$

Referring to FIG. 7, a description will be given of the operation of the input protection circuit in case where the normal potential which is in the input range where the inverting amplifier circuit 10 operates normally is applied to the input terminal T1. The potential level V1 of the input signal applied to the input terminal T1 is converted to the potential level V3 according to the equation 1 in the inverting amplifier circuit 10 and the converted potential level V3 is then transferred to the IC internal circuit 11. Here, the resistance r1 of the resistor R1 can be set greater than the resistance r2 of the resistor R2 and the amplification gain of the inverting amplifier circuit 10 can be set equal to or smaller than 1. In this case, as shown in FIG. 7, even if the input signal potential V1 greater than the positive power-supply potential level VDD is applied to the input terminal T1, it is possible to convert the input signal potential V1 to the signal potential V3 that falls in the range between the power-supply potentials VDD and VSS by attenuating the potential V1 and shifting its level in the inverting amplifier circuit 10 and then transfer the potential V3 to the IC internal circuit 11. Because the potential V2 at the virtual ground node N1 is kept at the same potential as the bias potential VC at this time, the bias potential VC, if having been set to VSS<VC (=V2)<VDD, prevents the protection diode D1 from being applied with the forward bias voltage so that the protection diode D1 is not turned on. The protection diode D2 will not be turned on unless the input signal potential V1 goes lower than the negative power-supply potential level VSS.

In the input protection circuit according to the first embodiment, as apparent from the above, an input current I50 does not flow into the protection diodes D1 and D2 in the input range where the inverting amplifier circuit 10 operates normally. Accordingly, the input signal V1 is not deformed by the leak current of the protection diodes D1 and D2, thus allowing the input signal V1 to be input to the IC internal circuit 11 in the proper state.

Further, the input protection circuit according to the first embodiment can set the loop gain of the inverting amplifier circuit 10 (the ratio of the resistance of the resistor R1 to the resistance of the resistor R2) and the bias potential level VC to arbitrary adequate values according to the level of the input signal V1. This makes it possible to convert the input signal V1 of every level to the signal V3 that can be processed in the internal circuit and transfer the signal V3 to the IC internal circuit 11 without being restricted by the positive power-supply potential level VDD of the semiconductor integrated circuit and without providing an attenuator and a level shift circuit outside the semiconductor integrated circuit.

Referring to FIGS. 8 and 9, a description will now be given of the operation of the input protection circuit in case where an excess voltage (surge voltage) which significantly goes way over the input range of the inverting amplifier circuit 10 is applied to the input terminal T1. As one example of this case, an excess voltage exceeding significantly the input range of the inverting amplifier circuit 10 is applied to the input terminal T1 due to static electricity or the like.

In case where a positive potential far greater than the positive power-supply potential VDD is applied to the input terminal T1 as shown in FIG. 8, the input potential V1 becomes considerably higher than the positive power-supply potential VDD so that the output potential V3 of the inverting amplifier circuit 10 stays put to the lower-limit potential (near VSS). Because the input potential V1 at the input terminal T1 is a positive potential far greater than the positive power-supply potential VDD, the potential at the virtual ground node N1 rises with an increase in input potential level V1 and exceeds the positive power-supply potential VDD.

Given that the threshold voltage of the protection diode D1 is VF, when the potential at the virtual ground node N1 exceeds VDD+VF, the protection diode D1 is forward-biased and turned on. As a result, a current I41 flows to the positive power-supply terminal from the input terminal T2 via the resistor R1 and the protection diode D1. If the voltage to be applied to the protection diode D2 is higher than the reverse breakdown voltage (which is generally about several tense of voltages) at this time, a current I41D (the reverse breakdown current of the protection diode D2) flows toward the negative power-supply terminal T3 from the input terminal T1 via the protection diode D2.

The current that flows out of the input terminal T1 is mainly separated into the current I41 and the current I41D. As the ON resistance of the protection diode D1 can be made sufficiently lower than the resistance r2 of the resistor R2, a current I42 which flows into the operational amplifier OP and the IC internal circuit 11 becomes considerably smaller. Further, the potential at the virtual ground node N1 does not go far above VDD+VF, preventing an excess voltage from being applied to the input section of the operational amplifier OP. In case where the input voltage V1 becomes higher than the reverse breakdown voltage of the protection diode D2, the reverse ON resistance of the protection diode D2 becomes sufficiently lower than the resistance r1 of the resistor R1, making the current I41 flowing to the resistor R1 significantly smaller.

When a negative potential considerably lower than the negative power-supply potential VSS is applied to the input terminal T1, as shown in FIG. 9, the protection diode D2 is turned on, causing a current I53 to flow toward the input terminal T1 via the protection diode D2 from the negative power-supply terminal T3.

As the ON resistance of the protection diode D2 can be set sufficiently lower than the resistances r1 and r2 of the resistors R1 and R2, a current I54 flowing out of the operational amplifier OP and the IC internal circuit 11 becomes extremely small. The potential at the virtual ground node N1 does not becomes considerably lower than VSS–VF.

When an excess voltage (surge voltage) is applied to the input terminal T1, as apparent from the above, the protection diode D1 or D2 is turned on in the input protection circuit of the first embodiment. This can prevent an excess current from flowing into the IC internal circuit 11 and the operational amplifier OP so that the IC internal circuit 11 and the operational amplifier OP can be protected against a static damage.

Further, as the protection diode D2 is connected directly to the input terminal T1 in the input protection circuit of the first embodiment, the current that flows across the resistor R1 can be made smaller. It is therefore possible to suppress a voltage applied across the resistor R1 lower. This can protect the IC internal circuit 11 and the operational amplifier OP against a static damage and can also prevent the input resistor R1 from being damaged by an excess voltage or an excess current.

According to the input protection circuit of the first embodiment, as described above, when the potential level of the input signal V1 applied to the input terminal T1 may go higher than the positive power-supply potential level VDD but does not go lower than the negative power-supply potential level VSS, as shown in FIG. 7, the input signal V1 can be transferred to the IC internal circuit 11 in the proper state without being deformed, and, when an excess voltage (surge voltage) is applied to the input terminal T1, the protection diode D1 or D2 is turned on to prevent the IC internal circuit 11, the operational amplifier OP and the input resistor R1 from being damaged by an excess voltage or an excess current.

Further, as the potential V2 at the virtual ground node N1 is always kept at the steady potential VC in the input protection circuit of the first embodiment, the input impedance can be determined by the resistance r1 of the resistor R1 alone. This can ensure efficient designing of a semiconductor integrated circuit.

(Second Embodiment)

In an input protection circuit according to the second embodiment of the invention, two protection diodes are connected between an input terminal and positive and negative power supplies, respectively, and the protection diode located between the input terminal and the positive power supply is connected directly to the input terminal.

Figure 10:
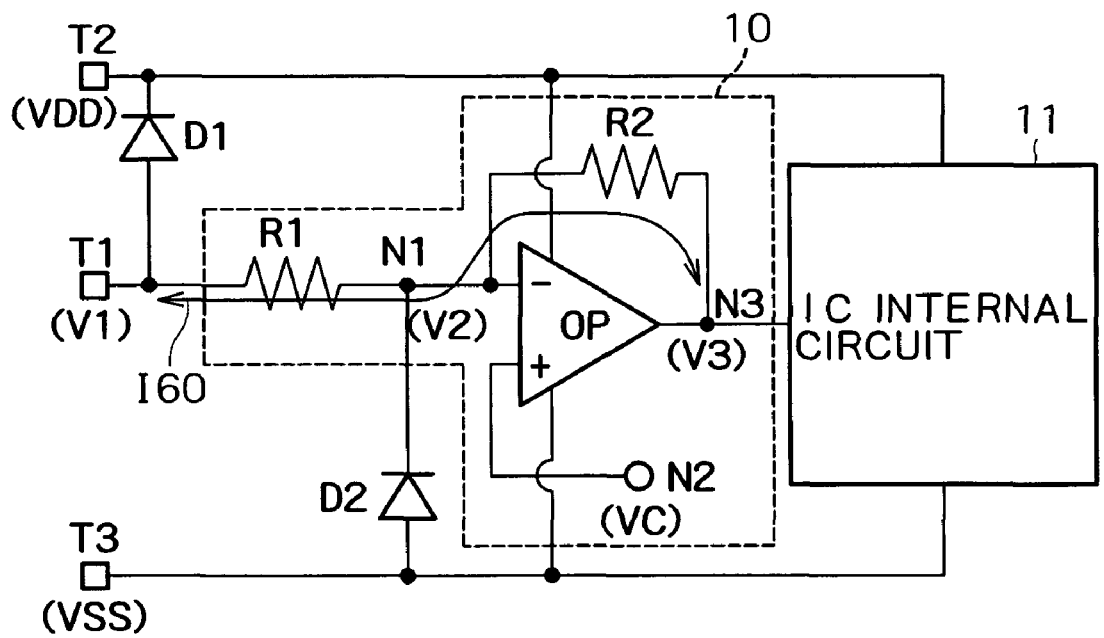
FIG. 10 is a block diagram showing an input protection circuit according to a second embodiment of the invention.

First, the input protection circuit of the second embodiment will be discussed referring to FIG. 10. FIG. 10 is a block diagram showing the input protection circuit according to the second embodiment. As shown in FIG. 10, the input protection circuit of the second embodiment, like the first embodiment, comprises an inverting amplifier circuit 10 and protection diodes D1 and D2 as basic components. Because the inverting amplifier circuit 10 is constructed in the same way as that of the first embodiment, its description will not be repeated. Likewise, the protection diodes D1 and D2 can be designed in the same way as those of the first embodiment.

As shown in FIG. 10, the protection diode D1 is connected to the positive power-supply terminal T2 and the signal input terminal T1. The protection diode D2 is also connected in such a way as to be forward-biased as viewing the positive power-supply terminal T2 from the signal input terminal T1. The protection diode D2 is connected to the negative power-supply terminal T3 and the virtual ground node N1 of the inverting amplifier circuit 10, as shown in FIG. 10. That is, the protection diode D2 is connected to the inverting input terminal (–) of the operational amplifier OP. The protection diode D2 is also connected in such a way as to be reverse-biased as viewing the negative power-supply terminal T3 from the virtual ground node N1.

Figure 11:
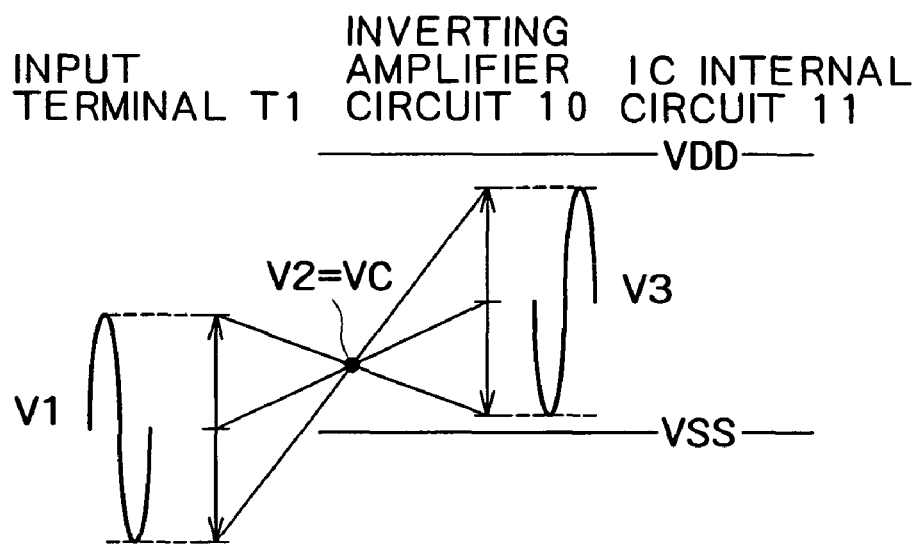
FIG. 11 is a signal level diagram illustrating an input signal to the input protection circuit according to the second embodiment of the invention.
Figure 12:
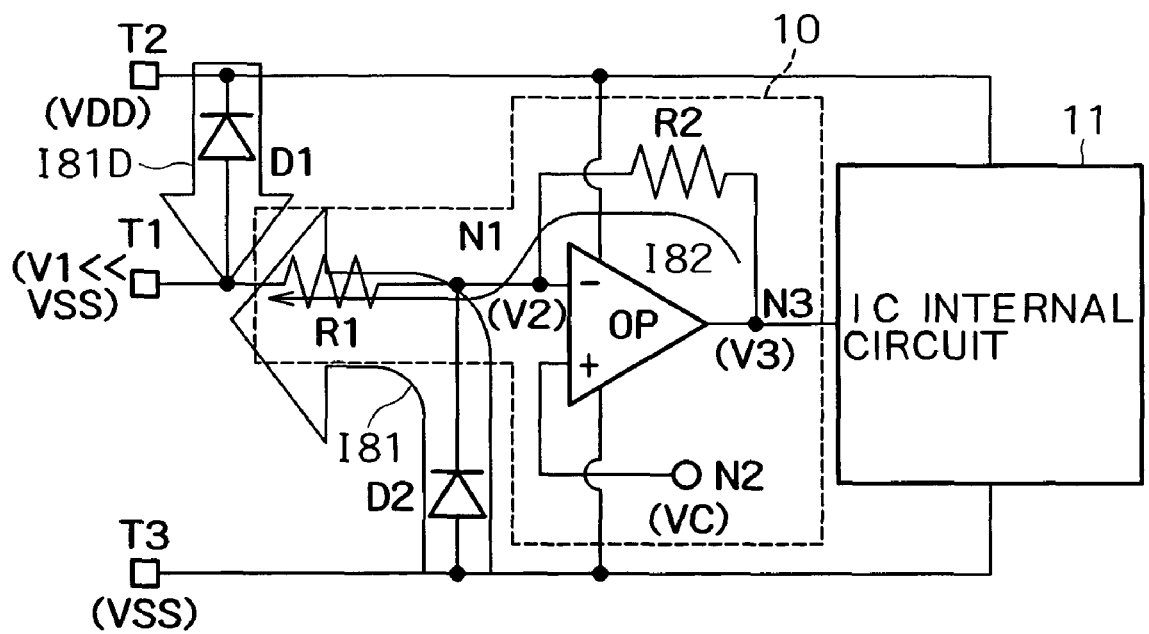
FIG. 12 is a block diagram illustrating the operation of the input protection circuit according to the second embodiment of the invention.
Figure 13:
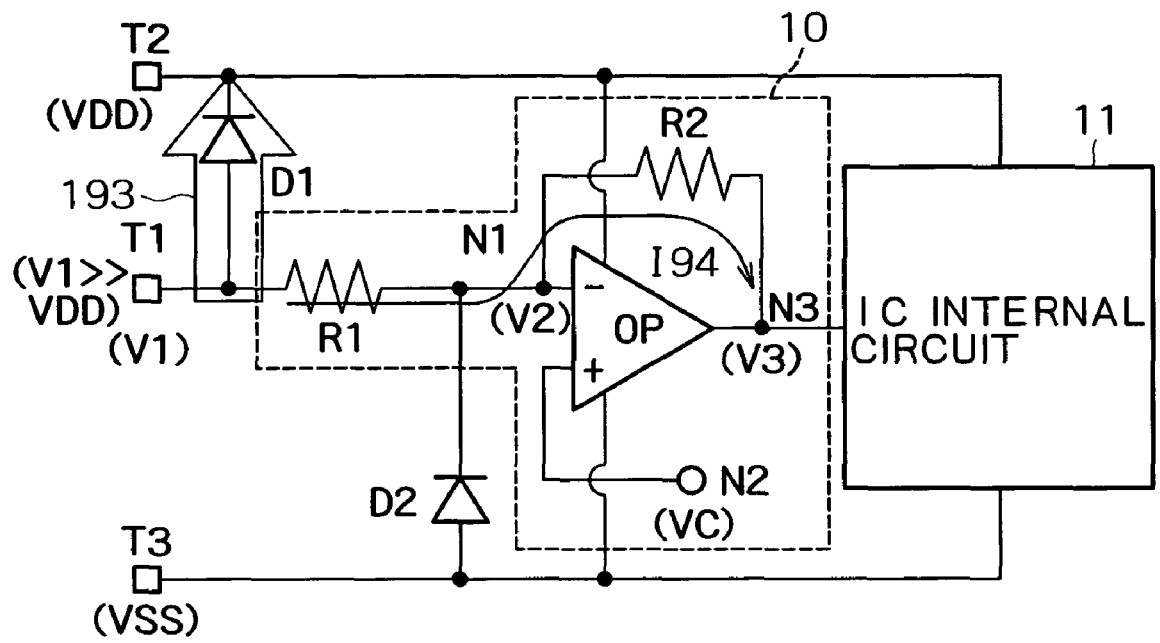
FIG. 13 is a block diagram illustrating the operation of the input protection circuit according to the second embodiment of the invention.

Referring now to FIGS. 11 to 13, the operation of the input protection circuit according to the second embodiment will be discussed. FIG. 11 is a signal level diagram illustrating an input signal to the input protection circuit according to the second embodiment. FIGS. 12 and 13 are block diagrams illustrating the operation of the input protection circuit according to the second embodiment.

Referring to FIG. 11, a description will be given of the operation of the input protection circuit in case where the normal potential which is in the input range where the inverting amplifier circuit 10 operates normally is applied to the input terminal T1. The potential level V1 of the input signal applied to the input terminal T1 is converted to the potential level V3 in the inverting amplifier circuit 10 and the converted potential level V3 is then transferred to the IC internal circuit 11, as per the first embodiment. Provided that the amplification gain of the inverting amplifier circuit 10 is set equal to or smaller than 1, even if the input signal potential V1 lower than the negative power-supply potential level VSS is applied to the input terminal T1, as shown in FIG. 11, it is possible to convert the input signal potential V1 to the signal potential V3 that falls in the range between the power-supply potentials VDD and VSS by attenuating the potential V1 and shifting its level in the inverting amplifier circuit 10 and then transfer the potential V3 to the IC internal circuit 11. Because the potential V2 at the virtual ground node N1 is always kept at the same potential as the bias potential VC at this time, the protection diode D2 will not be turned on. The protection diode D1 will not be turned on either unless the input signal potential V1 becomes higher than the positive power-supply potential level VDD.

In the input protection circuit according to the second embodiment, as apparent from the above, an input current I60 does not flow into the protection diodes D1 and D2 in the input range where the inverting amplifier circuit 10 operates normally. Accordingly, the input signal V1 is not deformed by the leak current of the protection diodes D1 and D2, thus allowing the input signal V1 to be input to the IC internal circuit 11 in the proper state.

Further, the input protection circuit according to the second embodiment can set the gain of the inverting amplifier circuit 10 (the ratio of the resistance of the resistor R1 to the resistance of the resistor R2) and the bias potential level VC to arbitrary adequate values according to the level of the input signal V1. This makes it possible to convert the input signal V1 of every level to the signal V3 that can be processed in the internal circuit and transfer the signal V3 to the IC internal circuit 11 without being restricted by the negative power-supply potential level VSS of the semiconductor integrated circuit and without providing an attenuator and a level shift circuit outside the semiconductor integrated circuit.

Referring to FIGS. 12 and 13, a description will now be given of the operation of the input protection circuit in case where an excess voltage (surge voltage) which significantly goes way over the input range of the inverting amplifier circuit 10 is applied to the input terminal T1. One example of such a case is the case where an excess voltage exceeding significantly the input range of the inverting amplifier circuit 10 is applied to the input terminal T1 due to static electricity or the like.

In case where a negative potential far lower than the negative power-supply potential level VSS is applied to the input terminal T1 as shown in FIG. 12, the input potential V1 becomes considerably lower than the negative power-supply potential level VSS so that the output potential V3 of the inverting amplifier circuit 10 stays put to the upper-limit potential (near VDD). Because the input potential V1 at the input terminal T1 is significantly lower than the negative power-supply potential level VSS, the potential at the virtual ground node N1 falls with a decrease in input potential level V1 and falls below the negative power-supply potential level VSS.

Given that the threshold voltage of the protection diode D1 is VF, when the potential at the virtual ground node N1 falls below VSS−VF, the protection diode D2 is forward-biased and turned on. As a result, a current I81 flows toward the input terminal T1 via the protection diode D2 and the resistor R1 from the negative power-supply terminal T3. If the voltage to be applied to the protection diode D1 is higher than the reverse breakdown voltage at this time, a current I81D (the reverse breakdown current of the protection diode D1) flows toward the input terminal T1 from the positive power-supply terminal T2 via the protection diode D1.

The current that flows into the input terminal T1 is mainly separated into the current I81 and the current I81D. As the ON resistance of the protection diode D2 can be made sufficiently higher than the resistances r1 and r2 of the resistors R1 and R2, a current I82 which flows from the operational amplifier OP and the IC internal circuit 11 becomes considerably smaller. Further, the potential at the virtual ground node N1 does not go far below VSS−VF, so that an excess voltage is not applied to the input section of the operational amplifier OP. In case where the input voltage V1 becomes higher than the reverse breakdown voltage of the protection diode D1, the reverse ON resistance of the protection diode D1 becomes sufficiently lower than the resistance r1 of the resistor R1, making the current I81 flowing to the resistor R1 significantly smaller.

When a potential far greater than the positive power-supply potential level VDD is applied to the input terminal T1, as shown in FIG. 13, the protection diode D1 is turned on, causing a current I93 to flow toward the positive power-supply terminal T2 via the protection diode D1 from the input terminal T1. As the ON resistance of the protection diode D1 can be set sufficiently lower than the resistances r1 and r2 of the resistors R1 and R2, a current I94 flowing into the operational amplifier OP and the IC internal circuit 11 becomes extremely small. The potential at the virtual ground node N1 does not go far above VDD+VF.

When an excess voltage (surge voltage) is applied to the input terminal T1, as apparent from the above, the protection diode D1 or D2 is turned on in the input protection circuit of the second embodiment. This can prevent an excess current from flowing into the IC internal circuit 11 and the operational amplifier OP so that the IC internal circuit 11 and the operational amplifier OP can be protected against a static damage.

Further, as the protection diode D1 is connected directly to the input terminal T1 in the input protection circuit of the second embodiment, the current that flows across the resistor R1 can be made smaller. It is therefore possible to suppress a voltage applied across the resistor R1 lower. This can protect the IC internal circuit 11 and the operational amplifier OP against a static damage and can also prevent the input resistor R1 from being damaged by an excess voltage or an excess current.

According to the input protection circuit of the second embodiment, as described above, in case where the potential level of the input signal V1 applied to the input terminal T1 may go lower than the negative power-supply potential level VSS but does not go higher than the positive power-supply potential level VDD, as shown in FIG. 11, the input signal V1 can be transferred to the IC internal circuit 11 in the proper state without being deformed, and, when an excess voltage (surge voltage) is applied to the input terminal T1, the protection diode D1 or D2 is turned on to prevent the IC internal circuit 11, the operational amplifier OP and the input resistor R1 from being damaged by an excess voltage or an excess current.

Further, as the potential V2 at the virtual ground node N1 is always kept at the steady potential VC in the input protection circuit of the second embodiment, the input impedance can be determined by the resistance r1 of the resistor R1 alone. This can ensure efficient designing of a semiconductor integrated circuit.

(Third Embodiment)

In an input protection circuit according to the third embodiment of the invention, two protection diodes are connected between an input terminal and positive and negative power supplies, respectively, and the protection diode located between the input terminal and the positive power supply is connected directly to the input terminal.

Figure 14:
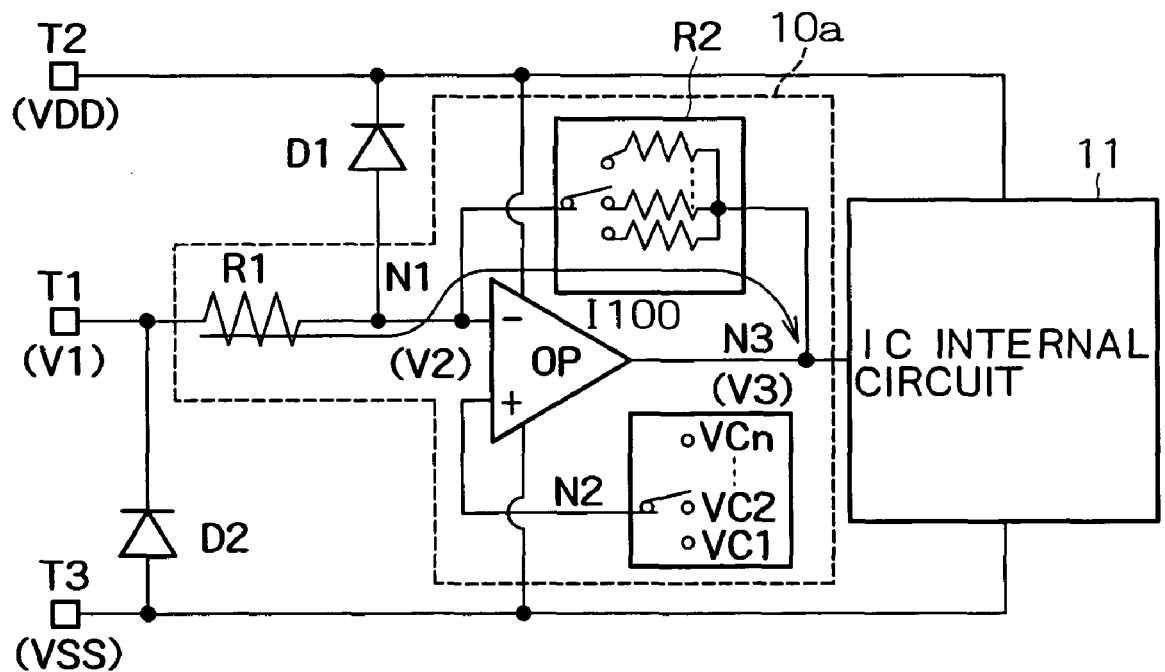
FIG. 14 is a block diagram showing an input protection circuit according to a third embodiment of the invention.

First, the input protection circuit of the third embodiment will be discussed referring to FIG. 14. FIG. 14 is a block diagram showing the input protection circuit according to the third embodiment. As shown in FIG. 14, the input protection circuit of the third embodiment, like the first embodiment, comprises an inverting amplifier circuit 10a and protection diodes D1 and D2 as basic components. Because the protection diodes D1 and D2 are constructed in the same way as those of the first embodiment, its description will not be repeated. The protection diodes D1 and D2 can be designed in the same way as those of the first embodiment.

Figure 15:
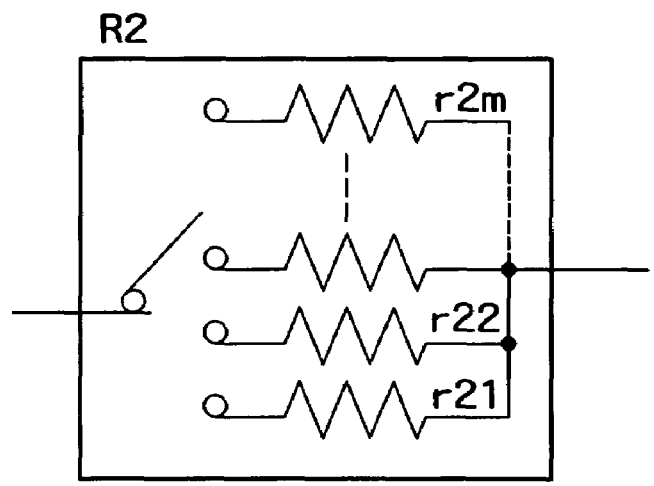
FIG. 15 is a block diagram showing resistors in the third embodiment of the invention.

As shown in FIG. 14, the inverting amplifier circuit 10a of the input protection circuit according to the third embodiment has a structure that can change the resistance of the resistor R2 and the bias potential level VC by means of switches. As shown in FIG. 15, the resistor R2 of the inverting amplifier circuit 10a is designed in such a way as to be able to switch the resistance in m ways from r21 to r2m using m switches. Likewise, the bias potential level VC to be input to the positive input terminal of the operational amplifier OP is designed in such a way that it can be switched in n ways from VC1 to VCn using n switches.

The operation of the input protection circuit of the third embodiment will be discussed below. In case where the normal voltage which lies in the input range where the inverting amplifier circuit 10a operates normally is applied to the input terminal T1, the input protection circuit of the third embodiment converts the potential level V1 of the input signal applied to the input terminal T1 to the potential level V3 in the inverting amplifier circuit 10a and transfers the potential level V3 to the IC internal circuit 11. Even if the input signal potential V1 greater than the positive power-supply potential level VDD is applied to the input terminal T1, it is possible to convert the input signal potential V1 to the signal potential V3 that falls in the range between the power-supply potentials VDD and VSS by attenuating the potential V1 and shifting its level in the inverting amplifier circuit 10a and then transfer the potential V3 to the IC internal circuit 11. Whichever resistance in r21 to r2m the resistance of the feedback resistor R2 is selected, the potential V2 at the virtual ground node N1 is always kept at the same potential as the bias potential VC in the input range where the inverting amplifier circuit 10a operates normally, the protection diode D1 will not be turned on.

In the input protection circuit according to the third embodiment, as apparent from the above, an input current I100 does not flow into the protection diodes D1 and D2 in the input range where the inverting amplifier circuit 10a operates normally. Accordingly, the input signal V1 is not deformed by the leak current of the protection diodes D1 and D2, thus allowing the input signal V1 to be input to the IC internal circuit 11 in the proper state.

Further, the input protection circuit according to the third embodiment can set the gain of the inverting amplifier circuit 10a (the ratio of the resistance of the resistor R1 to the resistance of the resistor R2) and the bias potential level VC to arbitrary adequate values according to the level of the input signal V1. This makes it possible to convert the input signal V1 of every level to the signal V3 that can be processed in the internal circuit and transfer the signal V3 to the IC internal circuit 11 without being restricted by the positive power-supply potential level VDD of the semiconductor integrated circuit and without providing an attenuator and a level shift circuit outside the semiconductor integrated circuit.

When an excess voltage (surge voltage) which significantly goes way over the input range of the inverting amplifier circuit 10a is applied to the input terminal T1, the input protection circuit according to the third embodiment performs the same operation as the first embodiment.

In case where a positive potential far greater than the positive power-supply potential level VDD is applied to the input terminal T1, the input current that is produced by this excess positive potential mostly flows to the positive power-supply terminal T2 from the input terminal T1 via the resistor R1 and the protection diode D1 or flows to the negative power-supply terminal T3 from the input terminal T1 via the protection diode D2 (reverse breakdown current). Accordingly, the current that flows into the operational amplifier OP and the IC internal circuit 11 becomes extremely small, preventing the excess voltage from being applied to the input section of the operational amplifier OP, so that the input section of the operational amplifier OP is not damaged by such an excess voltage.

In case where a negative potential far lower than the negative power-supply potential level VSS is applied to the input terminal T1, the current flows to the input terminal T1 from the negative power-supply terminal T3 via the protection diode D2 so that the current that flows to the input terminal T1 from the operational amplifier OP and the IC internal circuit 11 is extremely small.

When an excess voltage (surge voltage) is applied to the input terminal T1, as apparent from the above, the protection diode D1 or D2 is turned on in the input protection circuit of the third embodiment. This can prevent an excess current from flowing into the IC internal circuit 11 and the operational amplifier OP so that the IC internal circuit 11 and the operational amplifier OP can be protected against a static damage.

Further, as the protection diode D2 is connected directly to the input terminal T1 in the input protection circuit of the third embodiment, the current that flows across the resistor R1 can be made smaller. It is therefore possible to suppress a voltage applied across the resistor R1 lower. This can protect the IC internal circuit 11 and the operational amplifier OP against a static damage and can also prevent the input resistor R1 from being damaged by an excess voltage or an excess current.

According to the input protection circuit of the third embodiment, the adequate amplification factor and bias potential level VC can be set in accordance with the range of the input voltage V1 after fabrication of a semiconductor integrated circuit. This can allow a single circuit to be used in multifarious applications with different input signal ranges (specifications), thus contributing to reducing the manufacturing cost for semiconductor integrated circuits.

Further, in an application where the range of the input signal V1 varies significantly with the passage of time, efficient signal transfer can always be ensure by changing the amplification factor and bias potential level VC to adequate values in accordance with a change in signal range. This can permit the input signal V1 to be efficiently transferred to the IC internal circuit 11 in a proper state while preventing the IC internal circuit 11 and the operational amplifier OP from being damaged by an excess voltage or an excess current.

(Fourth Embodiment)

An input protection circuit according to the fourth embodiment of the invention is designed for a differential input signal whereas the input protection circuits according to the first to third embodiments are designed for a single end signal input.

In the input protection circuit of the fourth embodiment, two protection diodes are connected between the input terminal and the positive and negative power supplies, respectively, and the protection diode located between the input terminal and the negative power supply is connected directly to the input terminal as per the first embodiment. That is, the fourth embodiment is for the case where the first embodiment is adapted to a differential inverting amplifier circuit to which an input signal is differentially input. The protection diode located between the input terminal and the negative power supply may be connected directly to the input terminal as per the second and third embodiments.

Figure 16:
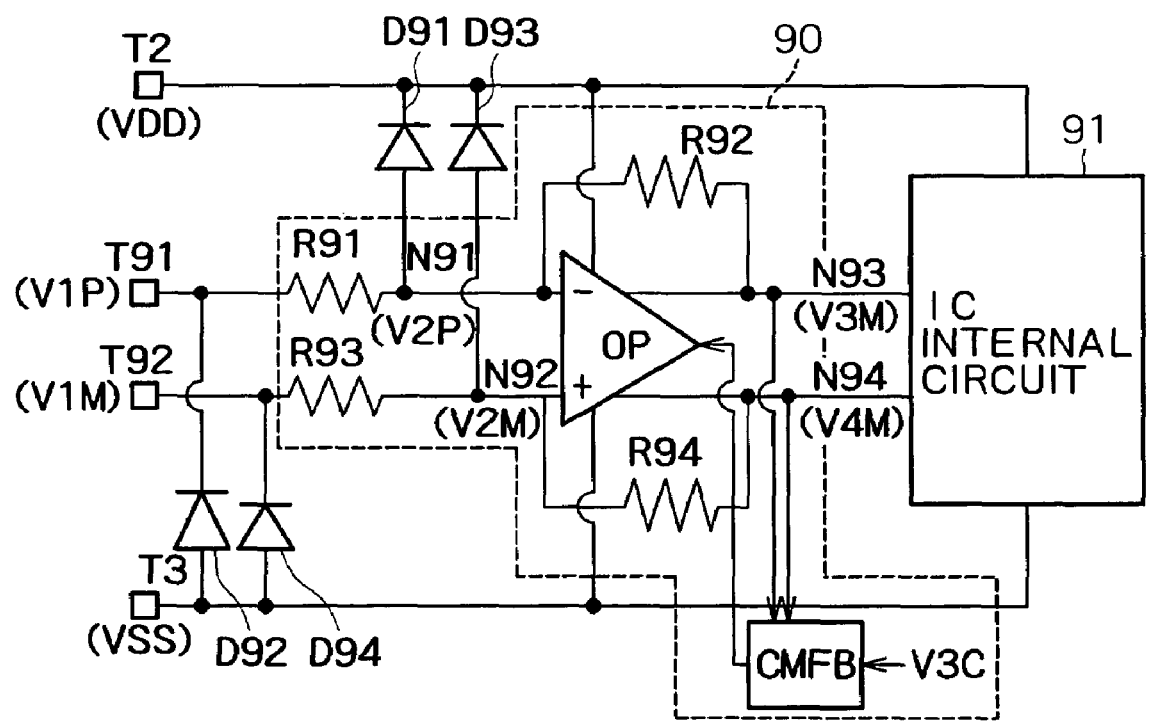
FIG. 16 is a block diagram showing an input protection circuit according to a fourth embodiment of the invention.

First, the input protection circuit of the fourth embodiment will be discussed referring to FIG. 16. FIG. 16 is a block diagram showing the input protection circuit according to the fourth embodiment. As shown in FIG. 16, the input protection circuit comprises a differential inverting amplifier circuit 90 and protection diodes D91, D92, D93 and D94 as basic components.

The differential inverting amplifier circuit 90 has a differential operational amplifier OPD, a common mode feedback circuit CMFB and resistors R91, R92, R93 and R94. The differential operational amplifier OPD is a well-known differential operational amplifier which amplifies a potential difference applied to the inverting input terminal indicated by symbol "−" (minus) and the non-inverting input terminal indicated by symbol "+" (plus) and outputs the amplified potential.

The common mode feedback circuit CMFB is of a well-known type and adjusts the internal bias level of the differential operational amplifier OPD in such a way that the intermediate potential of outputs V3P and V3M of the differential operational amplifier OPD becomes the same as a bias potential level V3C.

The resistors R91, R92, R93 and R94 are ordinary resistor elements similar to those of the first to third embodiments. Likewise, the protection diodes D91, D92, D93 and D94 are ordinary protection diodes similar to those of the first to third embodiments and can be constructed by using MOS transistors.

The protection diode D91 is connected to the positive power-supply terminal T2 and a virtual ground node N91 of the differential inverting amplifier circuit 90, as shown in FIG. 16. That is, the protection diode D91 is connected to the inverting input terminal (−) of the differential operational amplifier OPD. As shown in FIG. 16, the protection diode D91 is also connected in such a way as to be forward-biased as viewing the positive power-supply terminal T2 from the virtual ground node N91.

The protection diode D92 is connected to the negative power-supply terminal T3 and an input terminal T91. That is, the protection diode D92 is connected to the resistor R91. As shown in FIG. 16, the protection diode D92 is also connected in such a way as to be reverse-biased as viewing the negative power-supply terminal T3 from the input terminal T91. The signal input terminal T91 is connected to an IC internal circuit 91 via the input protection circuit which comprises the differential inverting amplifier circuit 90 and the protection diodes D91 and D92.

The protection diode D93 is connected to the positive power-supply terminal T2 and a virtual ground node N92 of the differential inverting amplifier circuit 90, as shown in FIG. 16. That is, the protection diode D93 is connected to the non-inverting input terminal (+) of the differential operational amplifier OPD. As shown in FIG. 16, the protection diode D93 is connected in such a way as to be forward-biased as viewing the positive power-supply terminal T2 from the virtual ground node N92.

The protection diode D94 is connected to the negative power-supply terminal T3 and an input terminal T92. That is, the protection diode D94 is connected to the resistor R93. As shown in FIG. 16, the protection diode D94 is connected in such a way as to be reverse-biased as viewing the negative power-supply terminal T3 from the input terminal T92. The signal input terminal T92 is connected to the IC internal circuit 91 via the input protection circuit which comprises the differential inverting amplifier circuit 90 and the protection diodes D93 and D94.

Figure 17:
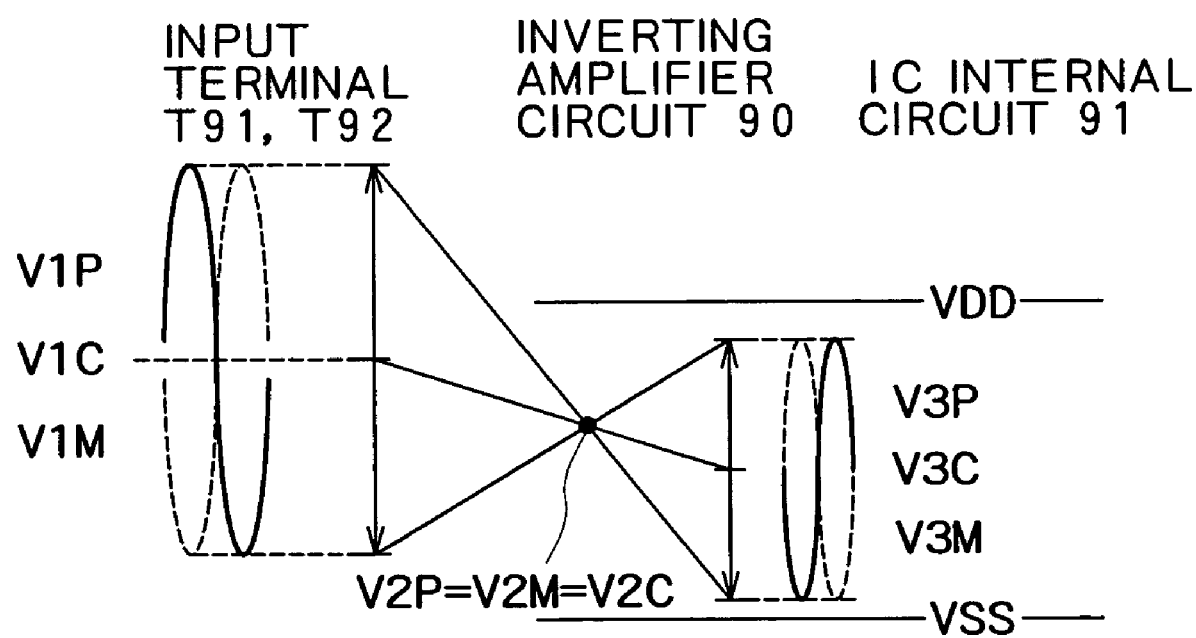
FIG. 17 is a signal level diagram illustrating an input signal to the input protection circuit according to the fourth embodiment of the invention.

Referring now to FIG. 17, the operation of the input protection circuit according to the fourth embodiment will be discussed. FIG. 17 is a signal level diagram illustrating an input signal to the input protection circuit according to the fourth embodiment.

FIG. 17 illustrates the relationship among the individual potential levels where VDD is the level of a potential to be applied to the positive power-supply terminal T2, VSS is the level of a potential applied to the negative power-supply terminal T3, V1OP and V1M are respectively the potential levels (input potentials) of the input differential signals to be applied to the input terminals T91 and T92, V3C is the level of the potential applied to the common mode feedback circuit CMFB and V3P and V3M are respectively the potential levels of an input differential signal to be input to the IC internal circuit 91.

In general, when the operational amplifier circuit has an ideal characteristic, the potential levels V2P and V2M at the virtual ground nodes N91 and N92 are always kept at the same potentials. Further, the real differential operational amplifier circuit can be assumed to be an element whose characteristic is close enough to the ideal characteristic. In the range where the differential inverting amplifier circuit 90 operates normally, therefore, the potential levels V2P and V2M at the virtual ground nodes N91 and N92 are kept at approximately the same potentials and it is possible to consider that V2P=V2M. Provided that the intermediate potential of the potential levels V2P and V2M at the virtual ground nodes N91 and N92 is V1C and the resistances of the resistors R91 and R93 are r1 and the resistances of the resistors R92 and R94 are r2 in the differential inverting amplifier circuit 90 in FIG. 16, the potential V2C (=V2P=V2M) at the virtual ground node is given by the following equation 2.

$$V2C = (r1/(r1+r2)) \times (V1C - VC) + VC \qquad (2)$$

Referring to FIG. 16, a description will be given of the operation of the input protection circuit in case where the normal potential which is in the input range where the differential inverting amplifier circuit 90 operates normally is applied to the input terminals T91 and T92. The input protection circuit according to the fourth embodiment operates in the same way as that of the first embodiment.

The input signals V1P and V1M applied to the input terminals T91 and T92 are converted to the signals V3P and V3M in the differential inverting amplifier circuit 90 and the signals V3P and V3M are then transferred to the IC internal circuit 91. Here, the resistances r1 of the resistors R91 and R93 can be set higher than the resistances r2 of the resistors R92 and R94 and the amplification gain of the differential inverting amplifier circuit 90 can be set equal to or smaller than 1. In this case, as shown in FIG. 17, even if the input signals V1P and V1M greater than the positive power-supply potential level VDD are applied to the input terminals T91 and T92, it is possible to convert the input signals V1P and V1M to the signals V3P and V3M that fall in the range between the power-supply potentials VDD and VSS by attenuating the input signals V1P and V1M and shifting their levels in the differential inverting amplifier circuit 90 and then transfer the signals V3P and V3P to the IC internal circuit 91. Because the potentials V2P and V2M at the virtual ground nodes N91 and N92 are kept at the same potential as the virtual ground potential V2C which is decided by the equation 2 at this time, the virtual ground potential V2C, if having been set to VSS<VC (=V2P=V2M) <VDD, prevents the protection diodes D91 and D93 from being applied with the forward bias voltage so that the protection diodes D91 and D93 are not turned on. Further, the protection diodes D92 and D94 will not be turned on unless the input potentials V1P and V1M become lower than the negative power-supply potential level VSS.

In the input protection circuit according to the fourth embodiment, as apparent from the above, the input current does not flow into the protection diodes D91ÿ D92, D93 and D94 in the input range where the differential inverting amplifier circuit 90 operates normally. Accordingly, the input signal V1 is not deformed by the leak current of the protection diodes D91ÿ D92, D93 and D94, thus allowing the input signals V1P and V1M to be input to the IC internal circuit 91 in the proper state.

Further, the input protection circuit according to the fourth embodiment can adequately set the loop gain of the differential inverting amplifier circuit 90 and the bias potential level V2c (=V2P=V2M) at the virtual ground node according to the levels of the input signals V1P and V1M. This makes it possible to convert the input signals V1P and V1M of every level to the signals V3P and V3M that can be processed in the internal circuit and transfer the signals V3P and V3M to the IC internal circuit 91 without being restricted by the positive power-supply potential level VDD of the semiconductor integrated circuit and without providing an attenuator and a level shift circuit outside the semiconductor integrated circuit.

A description will now be given of the operation of the input protection circuit in case where an excess voltage (surge voltage) which significantly goes way over the input range of the differential inverting amplifier circuit 90 is applied to the input terminals T91 and T92. One example of such a case is the case where an excess voltage exceeding significantly the input range of the differential inverting amplifier circuit 90 is applied to the input terminals T91 and T92 due to static electricity or the like.

In case where a positive potential far greater than the positive power-supply potential VDD is applied to the input terminals T91 and T92, the current produced by the positive input potential that is far greater than the positive power-supply potential level VDD mostly flows to the positive power-supply terminal T2 via the protection diodes D91 and D93 from the input terminals T91 and T92. If the voltage to be applied to the protection diodes D92 and D94 is higher than the reverse breakdown voltage (which is generally about several tense of voltages), a current (the reverse breakdown current of the protection diode D92) flows toward the negative power-supply terminal T3 from the input terminals T91 and T92 via the protection diodes D92 and D94. As apparent from the above, the current that flows from the differential operational amplifier OPD and the IC internal circuit 91 becomes extremely small, so that no excess voltage is applied to the input section of the differential operational amplifier OPD, thus preventing the input section of the differential operational amplifier OPD from being damaged by such an excess voltage.

When a negative potential considerably lower than the negative power-supply potential VSS is applied to the input terminals T91 and T93, a current flows to the input terminals T91 and T92 via the protection diodes D92 and D94 from the negative power-supply terminal T3. Therefore, the current that flows from the differential operational amplifier OPD and the IC internal circuit 91 becomes extremely small, so that no excess voltage is applied to the input section of the differential operational amplifier OPD. This prevents the differential operational amplifier OPD from being damaged by such an excess voltage.

When an excess voltage (surge voltage) is applied to the input terminals T91 and T92, as apparent from the above, the protection diodes D91, D92, D93 and D94 are turned on in the input protection circuit of the fourth embodiment. This can prevent an excess current from flowing into the IC internal circuit 91 and the differential operational amplifier OPD so that the IC internal circuit 91 and the differential operational amplifier OPD can be protected against a static damage.

Further, as the protection diodes D92 and D94 are connected directly to the input terminals T91 and T92, respectively, in the input protection circuit of the fourth embodiment, the currents that flow across the resistors R91 and R92 can be made smaller. It is therefore possible to suppress voltages applied across the resistors R91 and R92 lower. This can protect the IC internal circuit 91 and the differential operational amplifier OPD against a static damage and can also prevent the input resistors R91 and R92 from being damaged by an excess voltage or an excess current.

According to the input protection circuit of the fourth embodiment, as described above, when the potential levels of the input signals V1P and V1M applied to the input terminals T91 and T92 may go higher than the positive power-supply potential level VDD but do not become lower than the negative power-supply potential level VSS, as shown in FIG. 17, the input signals V1P and V1M can be transferred to the IC internal circuit 91 in the proper states without being deformed. When an excess voltage (surge voltage) is applied to the input terminals T91 and T92, the protection diodes D91 and D93 or the protection diodes D92 and D94 are turned on to prevent the IC internal circuit 91, the differential operational amplifier OPD and the input resistor R91 or R93 from being damaged by an excess voltage or an excess current.

Further, because the potentials V2P and V2M at the virtual ground nodes N91 and N92 are always kept at the steady potential V2C in the input protection circuit of the fourth embodiment, the input impedance can be determined by the resistance r1 of the resistor R91 or R93 alone. This can ensure efficient designing of a semiconductor integrated circuit.

The input protection circuit according to the fourth embodiment can adjust a signal with respect to a differential input signal by using the differential inverting amplifier circuit 90. It is therefore possible to adjust a signal with respect to a differential input signal and protect the IC internal circuit 91 against a static damage. Accordingly, the input protection circuit can input the input signal to the IC internal circuit 91 in a deformless and proper state while protecting the IC internal circuit 91 against a static damage and increasing the amplification factor of the input signal.

The invention is not limited to the limited to the first to fourth embodiments, but may be adapted to protect various semiconductor integrated circuits from a static damage. In the fourth embodiment, the second embodiment is adapted to an inverting amplifier circuit whose feedback resistor is a variable resistor and whose bias potential is variable, while in the fifth embodiment, the first embodiment is adapted to a applied to the inverting amplifier circuit. The invention is not however limited to those applications, but can be adapted to any internal circuit which needs to be protected against a static damage. The input protection circuit according to the invention can protect an internal circuit against a static damage and input an input signal to the internal circuit while keeping the input signal in the adequate state.

Although the foregoing description of the embodiments has been given of the case where an inverting amplifier circuit is used, the input protection circuit of the invention is not limited to an inverting amplifier circuit but may be adapted to a non-inverting amplifier circuit, an adder circuit, a differential circuit, an integrator circuit and so forth. While the input protection circuits of the embodiments of the invention can protect a resistor in the inverting amplifier circuit 10 (resistors R1, R91 or R93) against a static damage, the input protection circuit of the invention can protect various other elements, such as a capacitive element, or a circuit at the preceding stage of the input protection circuit, besides the resistor. Accordingly, the input protection circuit of the invention can protect not only the internal circuit but also its preceding circuit or element against a static damage.

In short, the invention can provide an input protection circuit which keeps the waveform of an input signal in a proper state while preventing a static damage and also prevents an input resistor from being statically damaged.

What is claimed is:

1. An input protection circuit for protecting an internal circuit from an excessive signal originated from static electricity, comprising:

input signal conversion section which has at least an input resistor, a feedback resistor and an operational amplifier having an input, and converts a potential of an input signal input from an input terminal in such a way that said potential of said input signal lies in an input range or a range of a signal potential inputtable to said internal circuit;

first protection section, connected to a virtual ground node between said input resistor and said operational amplifier and a first power-supply potential, for protecting said internal circuit by allowing an input current of said input signal to flow toward said first power-supply potential when said potential of said input signal excessively exceeds said input range on the said first power-supply potential side; and second protection section, connected to an arbitrary point between said input terminal and said input resistor and a second power-supply potential, for protecting said internal circuit by allowing said input current to flow toward said input terminal from said second power-supply potential when said potential of said input signal excessively exceeds said input range on the second power-supply potential side, wherein the first protection section is connected to a first node that also connects the input of the operational amplifier, the feedback resistor and the input resistor.

2. The input protection circuit according to claim 1, wherein said input signal conversion section converts said potential of said input signal input from said input terminal in such a way that said potential of said input signal lies in said input range when said potential of said input signal exceeds said first power-supply potential or said second power-supply potential.

3. The input protection circuit according to claim 1, wherein said operational amplifier changes a potential at said virtual ground node by changing a bias potential so as to convert said potential of said input signal input from said input terminal in such a way that said potential of said input signal having exceeded said input range lies in said input range.

4. The input protection circuit according to claim 1, wherein said feedback resistor has a plurality of resistors and a switch for switching connection of said plurality of resistors.

5. The input protection circuit according to claim 1, wherein said operational amplifier is a differential operational amplifier to which said input signal is differentially input.

6. The input protection circuit according to claim 1, wherein the first power-supply potential supplies a first power level to the internal circuit, and that the second power-supply potential supplies a second power level less than the first power level to the internal circuit.

7. The input protection circuit according to claim 1, wherein the first protection section consists of a first diode and the second protection section consists of a second diode.

8. The input protection circuit according to claim 1, wherein said operational amplifier is biased by a voltage between said first power-supply potential and said second power-supply potential.

9. An input protection circuit for protecting an internal circuit from an excessive signal originated from static electricity, comprising:

input signal conversion means which has at least input resistor means, feedback resistor means and operational amplifier means and converts a potential of an input signal input from an input terminal in such a way that said potential of said input signal lies in an input range or a range of a signal potential inputtable to said internal circuit;

first protection means, connected to an arbitrary point between said input terminal and said input resistor means and a first power-supply potential, for protecting said internal circuit by allowing an input current of said input signal to flow toward said first power-supply potential when said potential of said input signal excessively exceeds said input range on the said first power-supply potential side; and second protection means, connected to a virtual ground node between said input resistor means and said operational amplifier means and a second power-supply potential, for protecting said internal circuit by allowing said input current to flow toward said input terminal from said second power-supply potential when said potential of said input signal excessively exceeds said input range on the second power-supply potential side, wherein the first protection means is connected to a first node that also connects the input terminal and the input resistor means, and that the second protection means is connected to a second node that also connects the input resistor means and the operational amplifier means.

10. The input protection circuit according to claim 9, wherein said input signal conversion means converts said potential of said input signal input from said input terminal in such a way that said potential of said input signal lies in said input range when said potential of said input signal exceeds said first power-supply potential or said second power-supply potential.

11. The input protection circuit according to claim 9, wherein said operational amplifier means changes a potential at said virtual ground node by changing a bias potential so as to convert said potential of said input signal input from said input terminal in such a way that said potential of said input signal having exceeded said input range lies in said input range.

12. The input protection circuit according to claim 9, wherein said feedback resistor means has a plurality of resistors and a switch for switching connection of said plurality of resistors.

13. The input protection circuit according to claim 9, wherein said operational amplifier means is a differential operational amplifier to which said input signal is differentially input.

14. The input protection circuit according to claim 9, wherein the first power-supply potential supplies a first power level to the internal circuit, and that the second power-supply potential supplies a second power level less than the first power level to the internal circuit.

15. The input protection circuit according to claim 9, wherein the first protection means consists of a first diode and the second protection means consists of a second diode.

* * * * *